(12) United States Patent
Hughes et al.

(10) Patent No.: US 8,330,425 B2
(45) Date of Patent: Dec. 11, 2012

(54) SYSTEM FOR AND METHOD OF DETECTING A NON-FUNCTIONAL BATTERY BACK-UP UNIT (BBU) OF AN OPTICAL NETWORK TERMINAL

(75) Inventors: George L. Hughes, Wesley Chapel, FL (US); Bhaskar R. Gudlavenkatasiva, Tampa, FL (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 376 days.

(21) Appl. No.: 12/581,648

(22) Filed: Oct. 19, 2009

(65) Prior Publication Data

US 2011/0091203 A1    Apr. 21, 2011

(51) Int. Cl.
*H02J 7/00*    (2006.01)
*H02J 7/16*    (2006.01)
(52) U.S. Cl. ......... 320/137; 320/134; 320/136; 320/127
(58) Field of Classification Search .................. 320/134, 320/135, 136, 137, 127, 128, 129, 131, 132, 320/160, 161, 162; 398/17
See application file for complete search history.

(56) References Cited

U.S. PATENT DOCUMENTS

| | | | | |
|---|---|---|---|---|
| 5,710,503 A | * | 1/1998 | Sideris et al. | 324/431 |
| 5,825,156 A | * | 10/1998 | Patillon et al. | 702/63 |
| 5,936,385 A | * | 8/1999 | Patillon et al. | 320/136 |
| 7,394,394 B2 | * | 7/2008 | Lockhart et al. | 340/636.11 |
| 2008/0195881 A1 | * | 8/2008 | Bernard et al. | 713/340 |
| 2008/0240367 A1 | * | 10/2008 | Wynman | 379/2 |
| 2009/0006169 A1 | * | 1/2009 | Wetzer et al. | 705/8 |
| 2009/0310962 A1 | * | 12/2009 | Bernard et al. | 398/38 |
| 2010/0001586 A1 | * | 1/2010 | Bernard et al. | 307/65 |

* cited by examiner

*Primary Examiner* — Edward Tso
*Assistant Examiner* — Alexis Boateng

(57) ABSTRACT

A system for and method of for detecting a non-functional battery back-up unit (BBU) of an optical network terminal is presented. The system and method may include receiving power outage data associated with a plurality of customer sites, receiving, from each of the plurality of customer sites, discharge time data associated with a battery via a network, calculating a mean discharge time based on the discharge time data, comparing the discharge time data associated with each battery to the mean discharge time, determining that each battery that is associated with discharge time data that indicates a discharge time value that is less than the mean discharge time is faulty, and outputting a data signal that indicates that a battery is faulty.

9 Claims, 6 Drawing Sheets

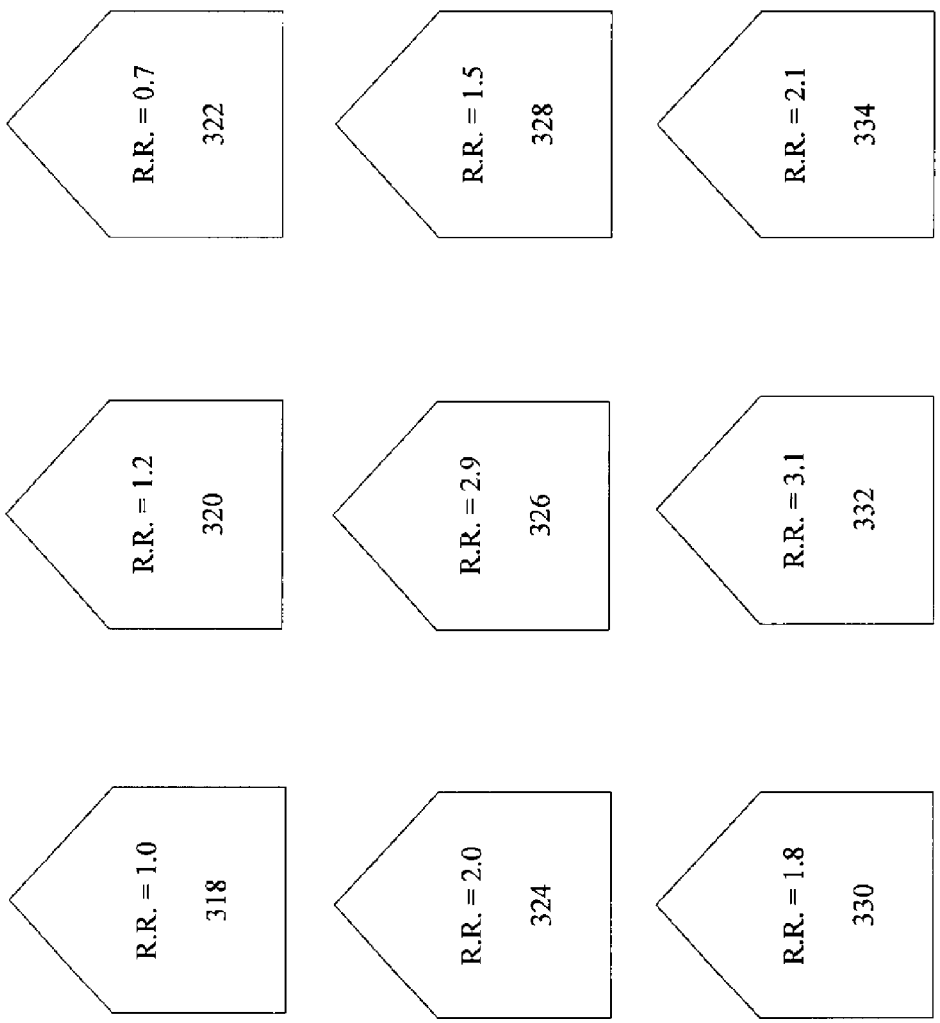

SYSTEM FOR AND METHOD OF DETECTING A NON-FUNCTIONAL BATTERY BACK-UP UNIT (BBU) OF AN OPTICAL NETWORK TERMINAL

BACKGROUND INFORMATION

In general, battery back-up units (BBUs) that are coupled to optical network terminals may be configured to provide a limited source of power to the optical network terminals in the event of a power failure. Overtime, however, these BBUs may become non-functional or faulty.

BRIEF DESCRIPTION OF THE DRAWINGS

The present invention, together with further objects and advantages, may best be understood by reference to the following description taken in conjunction with the accompanying drawings, in the several figures of which like reference numerals identify like elements, and in which:

FIG. 3B illustrates another block diagram of customer sites according to a particular embodiment;

DETAILED DESCRIPTION OF PREFERRED EMBODIMENTS

During installation of an optical network terminal (ONT) at a customer site, a technician associated with a service provider that provides one or more communication services (e.g., network communication services, telephone communication services, television communication services) may install a battery back-up unit (BBU) that is configured to supply power to the ONT in the event of a power failure. Since an ONT is relied upon to provide telephone services to a customer site, a power reserve that is sufficient to provide at least enough power to maintain telephone services in the event of an emergency (e.g., an event that causes a customer to call "911" for assistance) may be desirable. In the event of a power loss to the ONT (e.g., the ONT being unplugged, a power failure associated with a commercial power source), a BBU may supply the ONT with enough power to maintain standard voice services for a limited amount of time.

Overtime, a BBU may exhibit one or more characteristics (e.g., an indicator light is on) that indicate that the BBU is potentially non-functional (e.g., faulty). In such cases, a service provider may dispatch a technician to a customer site to determine whether the BBU is faulty. If, for example, the technician determines that a BBU is faulty, the technician may repair the BBU or replace the BBU during the service visit at the customer site. If, however, the technician determines that a BBU is not faulty, the technician may travel to the next customer site that is scheduled for a service visit. Such unnecessary service visits may be costly to the service provider.

A faulty BBU detection system may be configured to remotely detect that a BBU that is coupled to an ONT in a customer site is faulty using discharge time data, recharge time data, or a combination of both, from one or more BBUs that are located in customer sites of a particular geographic location. The faulty BBU detection system may receive discharge time data, recharge time data, or a combination of both, from one or more BBUs via a network, such as an optical network. Based on the data received, the faulty BBU detection system may calculate one or more statistics, such as a mean discharge time, a maximum discharge time, a mean recharge time, a minimum recharge time, etc. Through a series of one or more comparisons, the faulty BBU detection system may determine if a BBU is faulty.

Figure 1:
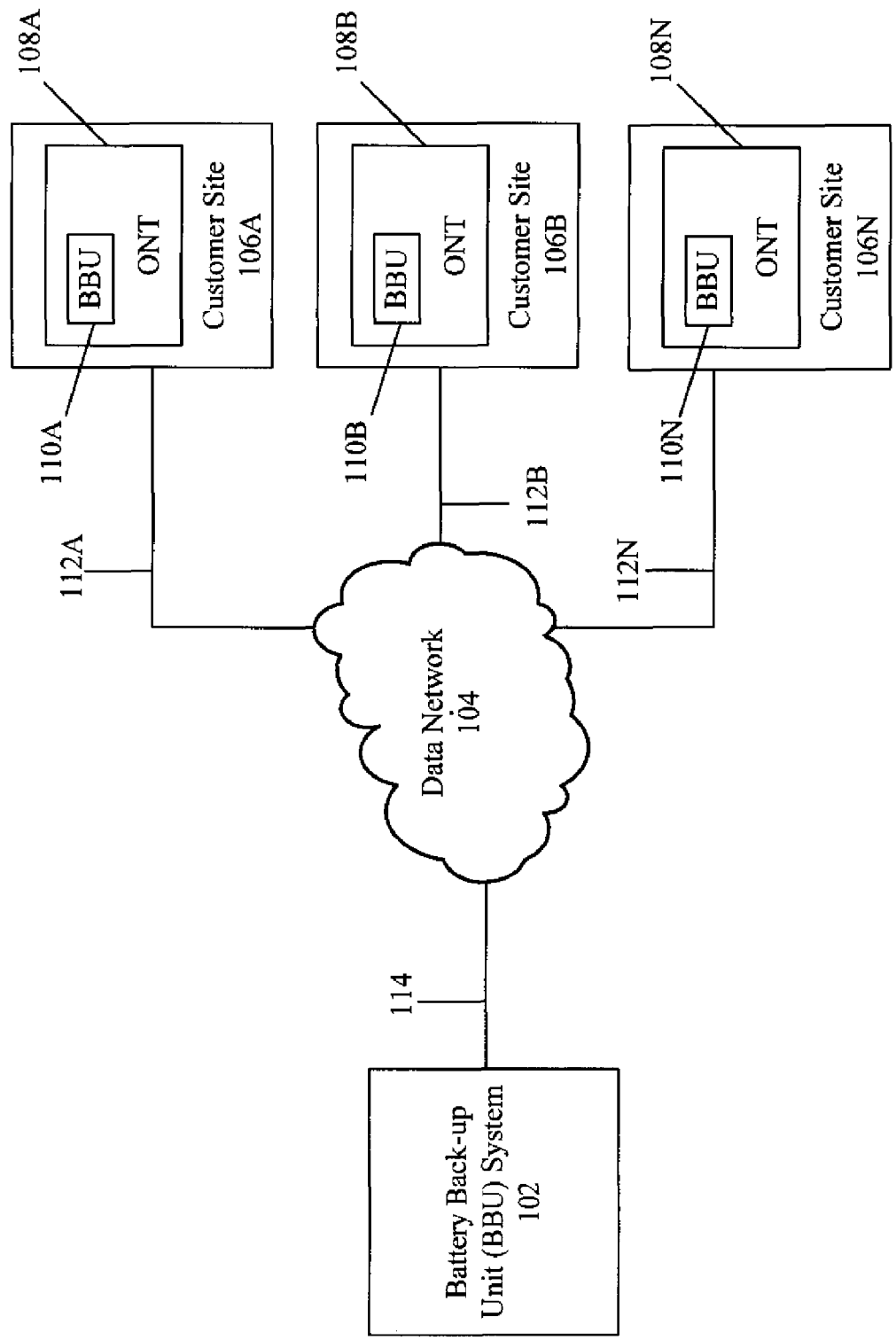
FIG. 1 is a schematic diagram illustrating a faulty battery back-up unit (BBU) detection system according to a particular embodiment.

FIG. 1 is a schematic diagram illustrating a faulty battery back-up unit (BBU) detection system according to a particular embodiment. A faulty BBU detection system may communicatively couple together any, or a combination, of a BBU system 102, customer sites 106A, 106B, 106N, that include ONTs 108A, 108B, 108N and BBUs 110A, 110B, 110N, respectively, using data network 104. Accordingly, data signals may be transmitted to any of the components of the faulty BBU detection system and transmitted from any of the components of the faulty BBU detection system using data network 104. For example, power outage data signals, power restored data signals, discharge time data signals, or recharge time data signals may be transmitted to any of the components of the faulty BBU detection system and transmitted from any of the components of the faulty BBU detection system using data network 104.

Data network 104 may be a wireless network, a wired network or any combination of wireless network and wired network. For example, data network 104 may include one or more of a fiber optics network, a passive optical network, a cable network, an Internet network, a satellite network (e.g., operating in Band C, Band Ku, or Band Ka), a wireless local area network (LAN), a Global System for Mobile Communication (GSM), a Personal Communication Service (PCS), a Personal Area Network (PAN), D-AMPS, Wi-Fi, Fixed Wireless Data, IEEE 802.11a, 802.11b, 802.15.1, 802.11n and 802.11g or any other wired or wireless network for transmitting and/or receiving a data signal. In addition, data network 104 may include, without limitation, a telephone line, fiber optics, IEEE Ethernet 802.3, a wide area network (WAN), a LAN, or a global network, such as the Internet. Also, data network 104 may support, an Internet network, a wireless communication network, a cellular network, or the like, or any combination thereof. Data network 104 may further include one, or any number of the exemplary types of networks mentioned above operating as a stand-alone network or in cooperation with each other. Data network 104 may utilize one or more protocols of one or more network elements to which it is communicatively coupled. Data network 104 may translate to or from other protocols to one or more protocols of network devices. Although data network 104 is depicted as one network, it should be appreciated that according to one or more embodiments, data network 104 may comprise a plurality of interconnected networks, such as, for example, a service provider network, the Internet, a broadcaster's network, a cable television network, corporate networks, and home networks.

BBU system 102, ONTs 108A, 108B, 108N, and BBUs 110A, 110B, 110N may transmit data to and receive data from data network 104 representing power outage data, power restored data, discharge time data, recharge time data, and other data. The data may be transmitted and received utilizing a standard telecommunications protocol or a standard networking protocol. For example, one embodiment may utilize Session Initiation Protocol (SIP). In other embodiments, the data may be transmitted, received, or a combination of both, utilizing other VoIP or messaging protocols. For example, data may also be transmitted, received, or a combination of both, using Wireless Application Protocol (WAP), Multimedia Messaging Service (MMS), Enhanced Messaging Service (EMS), Short Message Service (SMS), Global System for Mobile Communications (GSM) based systems, Code Division Multiple Access (CDMA) based systems, Transmission Control Protocol/Internet (TCP/IP) Protocols, or other protocols and systems suitable for transmitting and receiving data. Data may be transmitted and received wirelessly or may utilize cabled network or telecom connections such as: an Ethernet RJ45/Category 5 Ethernet connection, a fiber connection, a traditional phone wire-line connection, a cable connection, or other wired network connection. Data network 104 may use standard wireless protocols including IEEE 802.11a, 802.11b and 802.11g. Data network 104 may also use protocols for a wired connection, such as an IEEE Ethernet 802.3.

Customer sites 106A, 106B, 106N may include locations at which ONTs 108A, 108B, 108N and BBUs 110A, 110B, 110N are installed. Customer sites 106A, 106B, 106N may include any location at which a service provider has installed an ONT, a BBU, or a combination of both, to supply one or more communication services to a customer. For example, customer sites 106A, 106B, 106N may be any, or a combination, of a residential property, a multi-dwelling building, a commercial property, a public office building, a public school building, a university building.

ONTs 108A, 108B, 108N may be communicatively coupled to data network 104 via data paths 112A, 112B, 112N, respectively. ONTs 108A, 108B, 108N may include software, hardware, or a combination of both, configured to provide customer sites 106A, 106B, 106N with any, or a combination, of one or more telephone services, one or more network communication services, and one or more television services, respectively.

ONTs 108A, 108B, 108N may include any, or a combination, of a receiver, a transmitter, and a processor. In one embodiment, a processor of an ONT may be configured to identify a power loss at the ONT. In another embodiment, a processor of an ONT may be configured to identify the restoration of power at the ONT. Accordingly, ONTs 108A, 108B, 108N may be configured to transmit power outage data that indicates a loss of power (e.g., commercial power from a power utility company) or power restored data that indicates the restoration of power to the BBU system 102.

BBUs 110A, 110B, 110N may be communicatively coupled to data network 104 via data paths 112A, 112B, 112N, respectively. BBUs 110A, 110B, 110N may include executable software, hardware, or a combination of both, configured to transmit (e.g., output) discharge time data or recharge time data to the BBU system 102. Discharge time data may include data that is associated with a discharge time value that indicates an amount of time for the BBU to become fully discharged. Recharge time data may include data that is associated with a recharge time value that indicates an amount of time for the BBU to become fully recharged.

In one embodiment, a BBU may be configured to automatically output discharge time data when a power loss occurs at a customer site or transmit recharge time data when power is restored at the customer site. In another embodiment, a BBU may be configured to output discharge time data or recharge time data in response to a request from a network device, such as an ONT, a BBU system, etc.

BBU system 102 may be communicatively coupled to data network 104 via data path 114. The BBU system 102 may include, but is not limited to, a computer device or communications device including, e.g., a personal computer (PC), a workstation, a mobile device, a handheld PC, a thin system, a fat system, a network appliance, an Internet browser, a server, a lap top device, a set top box, a VoIP device, an ATA, a video server, a Public Switched Telephone Network (PSTN) gateway, a Mobile Switching Center (MSC) gateway, or any other device that is configured to receive power outage data, power restored data, discharge time data, and recharge time data via data path 114, calculate a mean discharge time, a maximum discharge time, a mean recharge time, a minimum recharge time, and determine if one or more BBUs are faulty. Details of the BBU system 102 are provided below.

One or more data paths disclosed herein may include any device that communicatively couples one or more devices to each other. For example, one or more data paths may include one or more networks (e.g., wireless, LAN, PON) or one or more conductive wires (e.g., copper wires).

Figure 2:
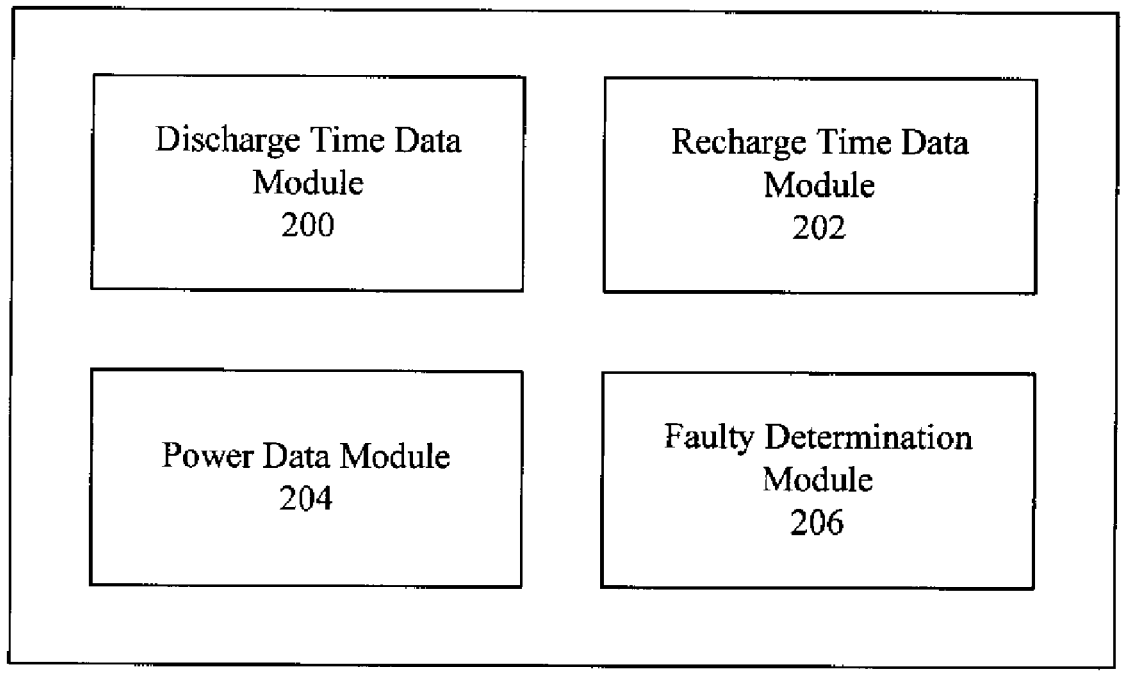
FIG. 2 is a block diagram of a hardware component of the BBU system of a particular embodiment.

FIG. 2 is a block diagram of a hardware component of the BBU system of a particular embodiment. The BBU system 102 may include a discharge time module 200, a recharge time module 202, a power data module 204, and a faulty determination module 206. It is noted that the modules 200, 202, 204, and 206 are exemplary. The functions of the modules 200, 202, 204, and 206, may be performed at other modules remote or local to the BBU system 102, and the modules 200, 202, 204, and 206 may be combined or separated.

The power data module 204 may include software, hardware, or a combination of both, configured to receive power outage data or power restored data from one or more ONTs (e.g., ONTs 108A, 108B, 108N) at one or more customer sites (e.g., customer sites 106A, 106B, 106N). For example, the power data module 204 may receive power outage data from a first ONT that indicates that the first ONT is not receiving power at a first customer site. In another example, the power data module 204 may receive power restored data from a second ONT that indicates that power has been restored to the second ONT at a second customer site. In yet another example, the power data module 204 may receive power outage data from a third ONT that indicates that the third ONT is not receiving power at a third customer site.

If, for example, the power data module 204 receives power outage data, the power data module 204 may select a group of BBUs associated with customer sites that are located in the approximate geographic location of the ONT that transmitted the power outage data (e.g., the approximate location of the loss of power) from which to receive or analyze discharge time data. If, however, the power data module 204 receives power restored data, the power data module 204 may select a group of BBUs associated with customer sites that are located in the approximate geographic location of the ONT that transmitted the power restored data (e.g., the approximate location of the restoration of power) from which to receive or analyze recharge time data.

In one embodiment, the customer sites that are considered to be in the approximate geographic location of the transmitting ONT may include those that are in the same community, neighborhood, community development, etc., as the transmitting ONT. In another embodiment, the customer sites that are considered to be in the approximate geographic of the transmitting ONT may include those that are within a predetermined distance to the transmitting ONT. For example, customer sites that are no farther than three miles away from the transmitting ONT may be considered to be in the approximate geographic location of the transmitting ONT. In another example, customer sites that are no farther than five miles away from the transmitting ONT may be considered to be in the approximate geographic location of the transmitting ONT. In yet another example, customer sites that are no farther than seven miles away from the transmitting ONT may be considered to be in the approximate geographic location of the transmitting ONT.

In one embodiment, the power data module 204 may initiate the processing of discharge time data received from the group of selected BBUs by the discharge time module 200 in the event power outage data is received. In another embodiment, the power data module 204 may initiate the processing of recharge time data received from the group of selected BBUs by the recharge time module 202 in the event power restored data is received.

The discharge time module 200 may include software, hardware, or a combination of both, configured to receive or process (e.g., analyze) discharge time data from a group of BBUs selected by the power data module 204. Accordingly, the discharge time module 200 may be configured to calculate a mean discharge time and a maximum discharge time based on the discharge time data received from the group of BBUs.

The recharge time module 202 may include software, hardware, or a combination of both, configured to receive or process (e.g., analyze) recharge time data from a group of BBUs selected by the power data module 204. Accordingly, the recharge time module 202 may be configured to calculate a mean recharge time and a minimum recharge time based on the recharge time data received from the group of BBUs.

The faulty determination module 206 may include software, hardware, or a combination of both, configured to determine if one or more BBUs in the group selected by the power data module 204 are faulty. In one embodiment, the faulty determination module 206 may determine if a BBU is faulty by comparing the discharge time value associated with the discharge time data of the BBU to the calculated mean discharge time. If, for example, the discharge time value of a BBU is less than the calculated mean discharge time, the faulty determination module 206 may determine that the BBU is faulty. If, however, the discharge time value of a BBU is not less than the calculated mean discharge time, the faulty determination module 206 may determine that the BBU is not faulty.

In another embodiment, the faulty determination module 206 may determine if a BBU is faulty by comparing the discharge time value associated with the discharge time data of the BBU to calculated maximum discharge time. The faulty determination module 206 may determine that each BBU that is associated with a discharge time value that is less than the maximum discharge time by a proportion (e.g., a proportion that is predetermined based on design preferences) is faulty. For example, the faulty determination module 206 may determine that each BBU that is associated with a discharge time value that is less than the maximum discharge time by 50% is faulty. In another example, the faulty determination module 206 may determine that each BBU that is associated with a discharge time value that is less than the maximum discharge time by 35% is faulty. In yet another example, the faulty determination module 206 may determine that each BBU that is associated with a discharge time value that is less than the maximum discharge time by 60% is faulty.

In one embodiment, the faulty determination module 206 may determine if a BBU is faulty by comparing the recharge time value associated with the recharge time data of the BBU to the calculated mean recharge time. If, for example, the recharge time value of a BBU is greater than the calculated mean recharge time, the faulty determination module 206 may determine that the BBU is faulty. If, however, the recharge time value of a BBU is not greater than the calculated mean recharge time, the faulty determination module 206 may determine that the BBU is not faulty.

In another embodiment, the faulty determination module 206 may determine if a BBU is faulty by comparing the recharge time value associated with the recharge time data of the BBU to the calculated minimum recharge time. The faulty determination module 206 may determine that each BBU that is associated with a recharge time value that is greater than the minimum recharge time by a proportion (e.g., a proportion that is predetermined based on design preferences) is faulty. For example, the faulty determination module 206 may determine that each BBU that is associated with a recharge time value that is greater than 50% of the minimum recharge time is faulty. In another example, the faulty determination module 206 may determine that each BBU that is associated with a recharge time value that is greater than 35% of the minimum recharge time is faulty. In yet another example, the faulty determination module 206 may determine that each BBU that is associated with a recharge time value that is greater than 60% of the minimum recharge time is faulty.

The faulty determination module 206 may be configured to output one or more data signals that indicate one or more BBUs are faulty. In one embodiment, outputting may include outputting a data signal to another system or module. In another embodiment, outputting may include outputting information to a user on a graphical user interface.

Figure 3A:
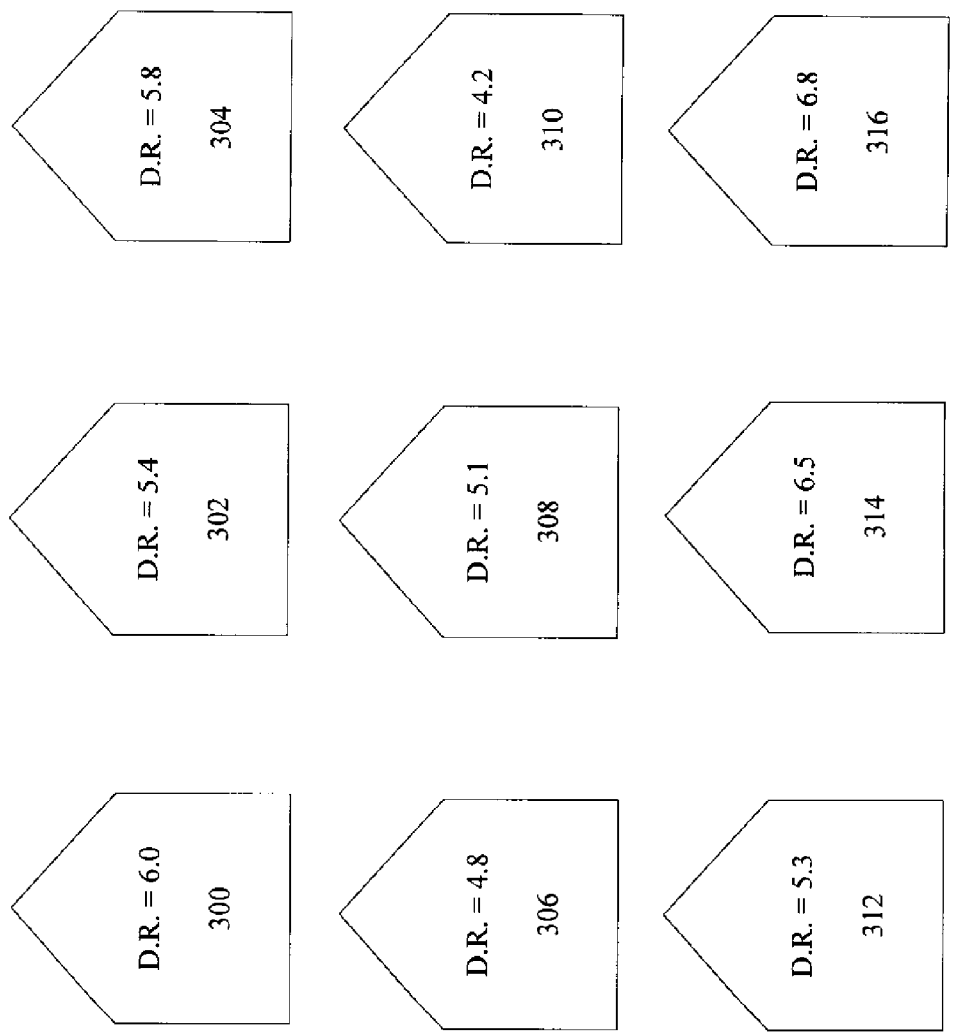
FIG. 3A illustrates a block diagram of customer sites according to a particular embodiment.

FIG. 3A illustrates a block diagram of customer sites according to a particular embodiment. By way of non-limiting example, the BBU system 102 may receive discharge time data from BBUs at customer sites 300, 302, 304, 306, 308, 310, 312, 314, 316 that indicate discharge time values of 6.0 hours, 5.4 hours, 5.8 hours, 4.8 hours, 5.1 hours, 4.2 hours, 5.3 hours, 6.5 hours, and 6.8 hours, respectively. Based on these discharge time values, the BBU system 102 may calculate a mean discharge time of approximately 5.5 hours.

In one embodiment, the BBU system 102 may determine that the BBUs that are associated with discharge time values that are less than the mean discharge rate are faulty. Accordingly, BBUs at customer sites 302, 306, 308, 310, 312 may be determined to be faulty.

FIG. 3B illustrates another block diagram of customer sites according to a particular embodiment. By way of non-limiting example, the BBU system 102 may receive recharge time data from BBUs at customer sites 318, 320, 322, 324, 326, 328, 330, 332, 334 that indicate recharge time values of 1.0 hours, 1.2 hours, 0.7 hours, 2.0 hours, 2.9 hours, 1.5 hours, 1.8 hours, 3.1 hours, and 2.1 hours, respectively. Based on these recharge time values, the BBU system 102 may calculate a mean recharge time of approximately 1.8 hours.

In one embodiment, the BBU system 102 may determine that the BBUs that are associated with recharge time values that are greater than the mean recharge time are faulty. Accordingly, BBUs at customer sites 324, 326, 332, 334 may be determined to be faulty.

Figure 4:
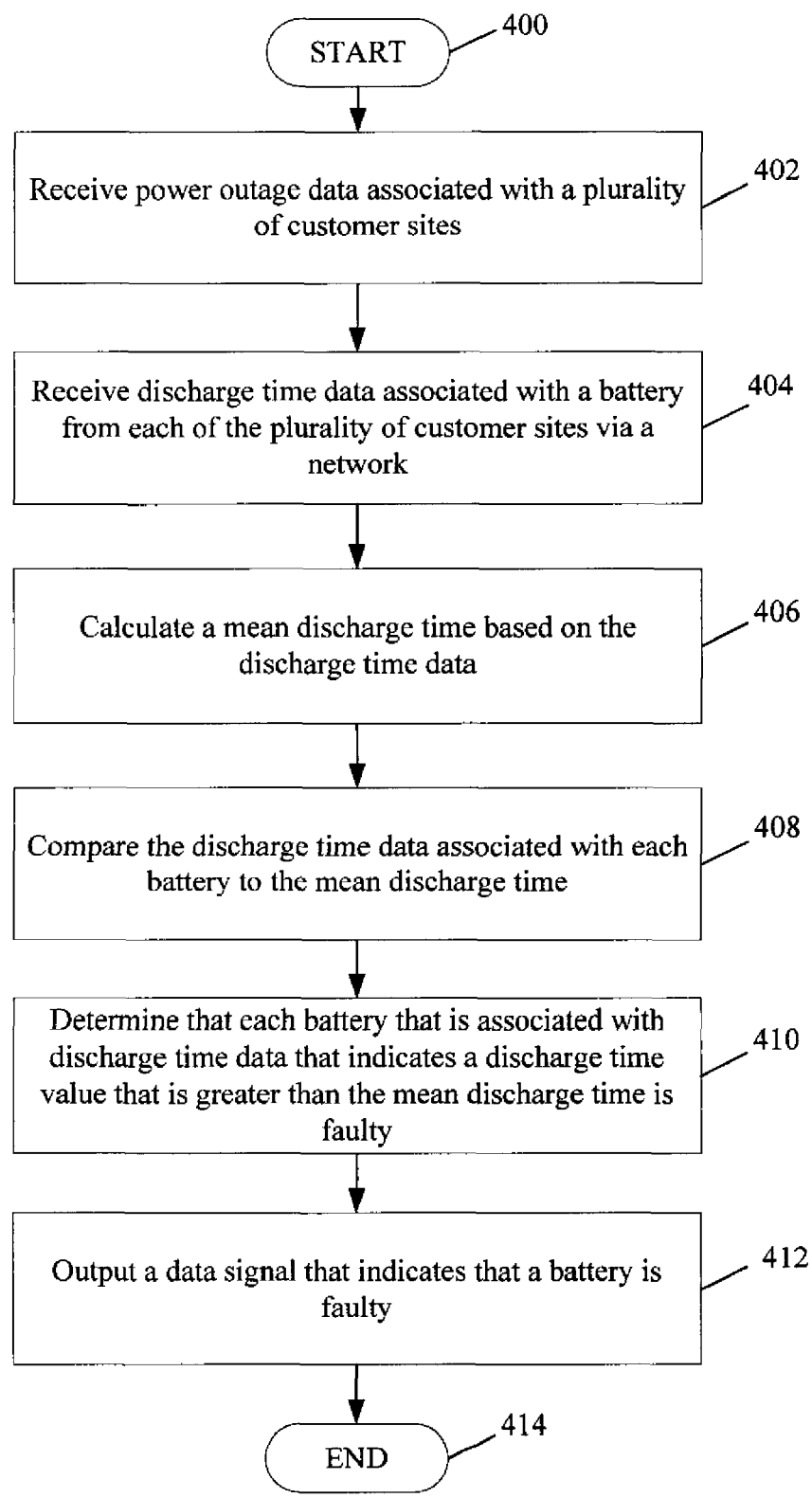
FIG. 4 is a flowchart illustrating the functionality of a particular embodiment.

FIG. 4 is a flowchart illustrating the functionality of a particular embodiment. This exemplary method is provided by way of example, as there are a variety of ways to carry out methods disclosed herein. The method shown in FIG. 4 may be executed or otherwise performed by one or a combination of various systems. The method is described below as carried out by the BBU system 102 shown in FIG. 1 by way of example, and various elements of the BBU system 102 are referenced in explaining the example method of FIG. 4. Each block shown represents one or more processes, methods, or subroutines carried out in the exemplary method. Referring to FIG. 4, the exemplary method may begin at block 400.

In block 402, the method may include receiving power outage data associated with a plurality of customer sites. In one embodiment, the power data module 204 of the BBU system 102 may receive power outage data associated with a plurality of customer sites. The method may continue to block 404.

In block 404, the method may include receiving discharge time data associated with a battery from each customer site. In one embodiment, the discharge time module 200 of the BBU system 102 may receive discharge time data associated with a battery from each customer site. The method may continue to block 406.

In block 406, the method may include calculating a mean discharge time based on the discharge time data. In one embodiment, the discharge time module 200 of the BBU system 102 may calculate a mean discharge time based on the discharge time data. The method may continue to block 408.

In block 408, the method may include comparing the discharge time data associated with each battery to the mean discharge time. In one embodiment, the faulty determination module 206 of the BBU system 102 may compare the discharge time data associated with each battery to the mean discharge time. The method may continue to block 410.

In block 410, the method may include determining that each battery that is associated with discharge time data that indicates a discharge time value that is less than the mean discharge time is faulty. In one embodiment, the faulty determination module 206 of the BBU system 102 may determine that each battery that is associated with discharge time data that indicates a discharge time value that is less than the mean discharge time is faulty. The method may continue to block 412.

In block 412, the method may include outputting a data signal that indicates that a battery is faulty. In one embodiment, the faulty determination module 206 of the BBU system 102 may output a data signal that indicates that a battery is faulty. The method may then end at block 414.

Figure 5:
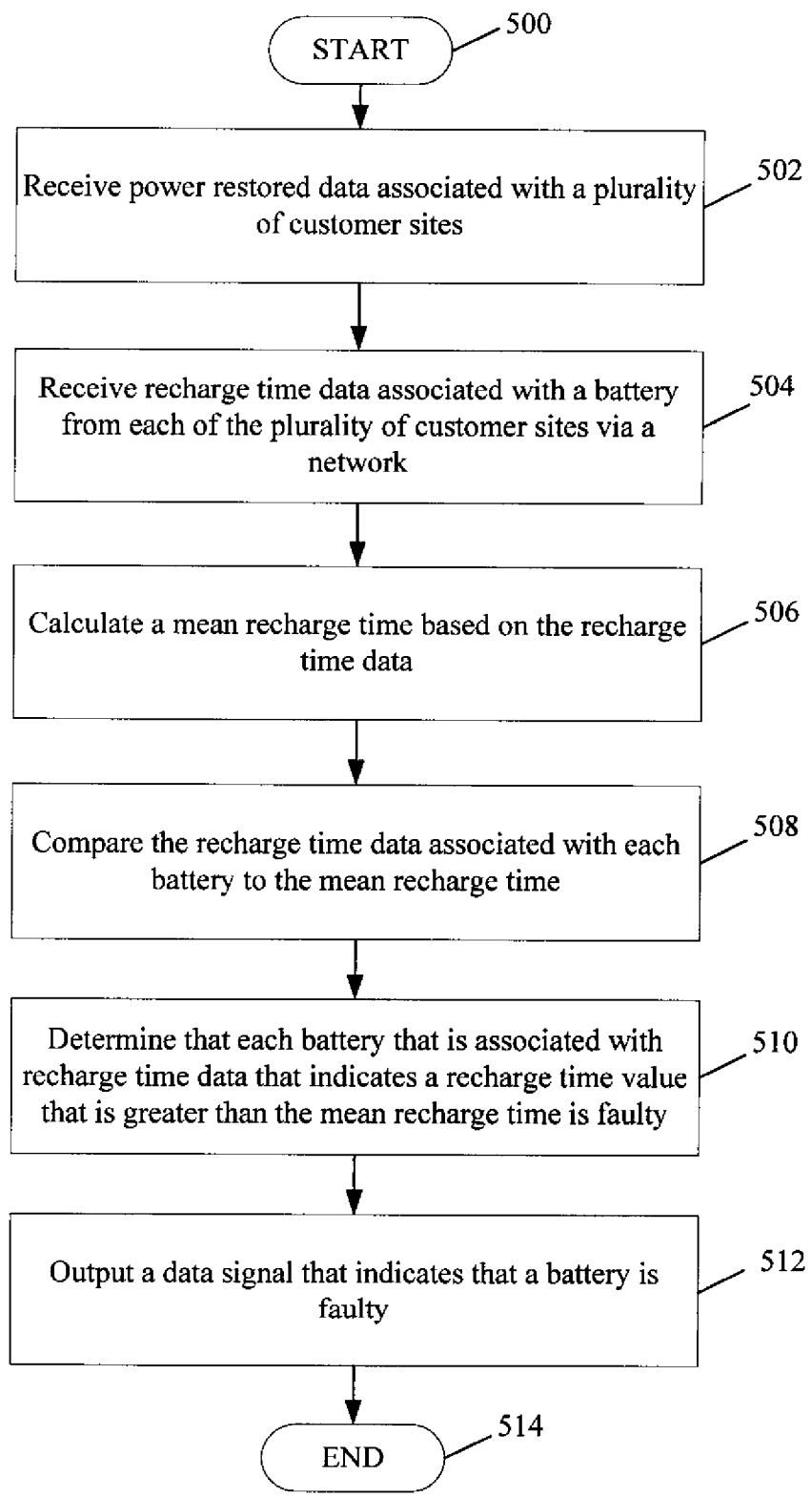
FIG. 5 is a another flowchart illustrating the functionality of a particular embodiment.

FIG. 5 is a another flowchart illustrating the functionality of a particular embodiment. This exemplary method is provided by way of example, as there are a variety of ways to carry out methods disclosed herein. The method shown in FIG. 5 may be executed or otherwise performed by one or a combination of various systems. The method is described below as carried out by the BBU system 102 shown in FIG. 1 by way of example, and various elements of the BBU system 102 are referenced in explaining the example method of FIG. 5. Each block shown in FIG. 5 represents one or more processes, methods, or subroutines carried out in the exemplary method. Referring to FIG. 5, the exemplary method may begin at block 500.

In block 502, the method may include receiving power restored data associated with a plurality of customer sites. In one embodiment, the power data module 204 of the BBU system 102 may receive restored outage data associated with a plurality of customer sites. The method may continue to block 504.

In block 504, the method may include receiving recharge time data associated with a battery from each customer site. In one embodiment, the recharge time module 202 of the BBU system 102 may receive recharge time data associated with a battery from each customer site. The method may continue to block 506.

In block 506, the method may include calculating a mean recharge time based on the recharge time data. In one embodiment, the recharge time module 202 of the BBU system 102 may calculate a mean recharge time based on the recharge time data. The method may continue to block 508.

In block 508, the method may include comparing the recharge time data associated with each battery to the mean recharge time. In one embodiment, the faulty determination module 206 of the BBU system 102 may compare the recharge time data associated with each battery to the mean recharge time. The method may continue to block 510.

In block 510, the method may include determining that each battery that is associated with recharge time data that indicates a recharge time value that is greater than the mean recharge time is faulty. In one embodiment, the faulty determination module 206 of the BBU system 102 may determine that each battery that is associated with recharge time data that indicates a recharge time value that is greater than the mean recharge time is faulty. The method may continue to block 512.

In block 512, the method may include outputting a data signal that indicates that a battery is faulty. In one embodiment, the faulty determination module 206 of the BBU system 102 may output a data signal that indicates that a battery is faulty. The method may then end at block 514.

In the preceding specification, various preferred embodiments have been described with references to the accompanying drawings. It will, however, be evident that various modifications and changes may be made thereto, and additional embodiments may be implemented, without departing from the broader scope of invention as set forth in the claims that follow. The specification and drawings are accordingly to be regarded in an illustrative rather than restrictive sense.

We claim:

1. A system, comprising:
    a power data computing apparatus configured to receive power outage data associated with a plurality of customer sites;
    a discharge time computing apparatus configured to receive, from each of the plurality of customer sites, discharge time data associated with a battery via a network and calculate a mean discharge time based on the discharge time data wherein the discharge time data is automatically output to the network for receipt by the discharge time computing apparatus when a power loss occurs; and
    a faulty determination computing apparatus configured to compare the discharge time data associated with each battery to the mean discharge time, determine that each battery that is associated with discharge time data that indicates a discharge time value that is less than the mean discharge time is faulty, and output a data signal that indicates that a battery is faulty.

2. The system of claim 1, wherein the power data computing apparatus is further configured to receive power outage data by receiving power outage data that indicates that the plurality of customer sites are not receiving power from a commercial power source.

3. The system of claim 1, wherein the discharge time value comprises a value that indicates an amount of time for the battery to become fully discharged.

4. The system of claim 1, wherein the discharge time computing apparatus is further configured to calculate a maximum discharge time based on the discharge time data.

5. The system of claim 4, wherein the faulty determination computing apparatus is further configured to compare the discharge time data associated with each battery to the maximum discharge time.

6. The system of claim 5, wherein the faulty determination computing apparatus is further configured to determine that each battery that is associated with discharge time data that indicates a discharge time value that is less than the maximum discharge time by a predetermined proportion is faulty.

7. The system of claim 6, wherein each battery is coupled to an optical network terminal.

8. The system of claim 7, wherein each battery is included in a different battery back-up unit of the optical network terminal.

9. The system of claim 1, wherein the network comprises an optical network.

* * * * *